US008968527B2

(12) United States Patent
Guan et al.

(10) Patent No.: US 8,968,527 B2
(45) Date of Patent: Mar. 3, 2015

(54) MICRO-FLUID EJECTION DEVICES, METHODS FOR MAKING MICRO-FLUID EJECTION HEADS, AND MICRO-FLUID EJECTION HEAD HAVING HIGH RESISTANCE THIN FILM HEATERS

(75) Inventors: Yimin Guan, Lexington, KY (US); Stuart Jacobsen, Frisco, TX (US); Carl Edmond Sullivan, Stamping Ground, KY (US)

(73) Assignee: Funai Electric Co., Ltd (JP)

( * ) Notice: Subject to any disclaimer, the term of this patent is extended or adjusted under 35 U.S.C. 154(b) by 690 days.

(21) Appl. No.: 12/690,955

(22) Filed: Feb. 16, 2010

(65) Prior Publication Data

US 2011/0094102 A1 Apr. 28, 2011

Related U.S. Application Data

(62) Division of application No. 11/683,572, filed on Mar. 8, 2007, now Pat. No. 7,673,972.

(60) Provisional application No. 60/883,905, filed on Jan. 8, 2007.

(51) Int. Cl.

| | |
|---|---|
| ***C23C 14/34*** | (2006.01) |
| ***C23C 16/00*** | (2006.01) |
| ***B41J 2/14*** | (2006.01) |

(52) U.S. Cl.

CPC .......... *B41J 2/14129* (2013.01); *B41J 2202/11* (2013.01); *B41J 2202/03* (2013.01)

USPC ............... 204/192.21; 204/192.15; 427/126.1

(58) Field of Classification Search

USPC ...................... 204/192.15, 192.21; 427/126.1

See application file for complete search history.

(56) References Cited

U.S. PATENT DOCUMENTS

| | | | | |
|---|---|---|---|---|
| 6,256,053 | B1 | 7/2001 | Noshita | |
| 6,527,813 | B1 * | 3/2003 | Saito et al. | 347/62 |
| 6,558,563 | B2 | 5/2003 | Kashiwaya et al. | |
| 6,773,764 | B2 | 8/2004 | Marinero et al. | |
| 6,805,431 | B2 | 10/2004 | Anderson et al. | |
| 2004/0179084 | A1 * | 9/2004 | Suzuki et al. | 347/204 |

FOREIGN PATENT DOCUMENTS

| | | | |
|---|---|---|---|
| JP | 2004-216889 | * | 8/2004 |
| WO | WO 2006/026333 | * | 3/2006 |

OTHER PUBLICATIONS

Machine Translation JP 2004-216889 dated Aug. 2004.*

* cited by examiner

*Primary Examiner* — Rodney McDonald

(74) *Attorney, Agent, or Firm* — Amster, Rothstein Ebenstein LLP

(57) ABSTRACT

Micro-fluid ejection devices, methods for making micro-fluid ejection heads, and micro-fluid ejection heads, including a micro-fluid ejection head. One such micro-fluid ejection head has relatively high resistance thin film heaters adjacent to a substrate. The thin film material comprises silicon, metal, and carbon (SiMC wherein M is a metal). Each thin film heater has a sheet resistance ranging from about 100 to about 600 ohms per square and a thickness ranging from about 100 to about 800 Angstroms.

5 Claims, 6 Drawing Sheets

Fig. 1
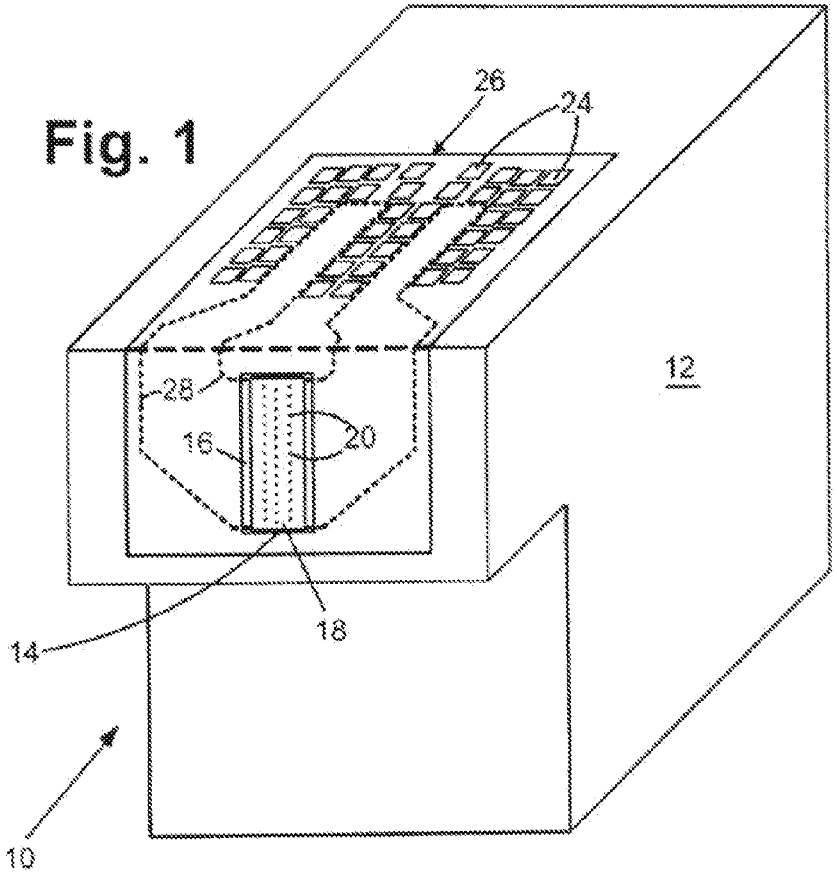
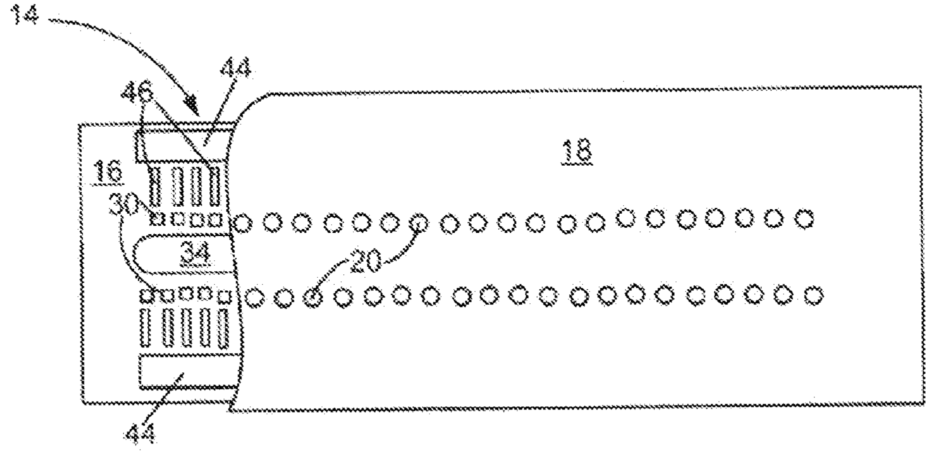
Fig. 4

MICRO-FLUID EJECTION DEVICES, METHODS FOR MAKING MICRO-FLUID EJECTION HEADS, AND MICRO-FLUID EJECTION HEAD HAVING HIGH RESISTANCE THIN FILM HEATERS

This is a divisional application of U.S. patent application Ser. No. 11/683,572 filed Mar. 8, 2007, now U.S. Pat. No. 7,673,972, entitled "MICRO-FLUID EJECTION DEVICES, METHODS FOR MAKING MICRO-FLUID EJECTION HEADS, AND MICRO-FLUID EJECTION HEADS HAVING HIGH RESISTANCE THIN FILM HEATERS."

TECHNICAL FIELD

The disclosure relates to micro-fluid ejection heads and, in a particular exemplary embodiment, to thin film heater resistors having high resistance.

BACKGROUND AND SUMMARY

Micro-fluid ejection devices such as ink jet printers continue to experience wide acceptance as economical replacements for laser printers. Micro-fluid ejection devices also are finding wide application in other fields such as in the medical, chemical, and mechanical fields. As the capabilities of micro-fluid ejection devices are increased to provide higher ejection rates, the ejection heads, which are the primary components of micro-fluid devices, continue to evolve and become more complex.

For example, higher resistance heater materials may be required in order to provide relatively large micro-fluid ejection head substrates so as to achieve faster fluid ejection speeds while using lower driving currents and lower nucleation energies. Higher resistance heater materials may also be required in order to provide ejection heads having less sensitivity to parasitic resistance thereby providing more consistent ejection droplet amounts. Accordingly, there continues to be a need for improved heater materials for micro-fluid ejection heads that can provide higher resistance, especially those that have greater bulk resistance and sheet resistance uniformity and a lower temperature coefficient of resistivity (TCR).

In one of the disclosed exemplary embodiments, a micro-fluid ejection head is provided that has relatively high resistance thin film heaters. The thin film heaters are made of silicon, metal and carbon (SiMC wherein M is a metal, such as chromium). The thin film heaters have a sheet resistance ranging from about 100 to about 600 ohms per square, and the SiMC thin film material of the heaters has a thickness ranging from about 100 to about 800 Angstroms.

In another exemplary embodiment, there is provided a method for making a micro-fluid ejection head, such as one for a micro-fluid ejection device. The method includes depositing a thin film material comprising silicon, metal and carbon (SiMC wherein M is a metal such as chromium) adjacent to a surface of a substrate to form a thin film resistive layer. The thin film resistive layer has a sheet resistance ranging from about 100 to about 600 ohms per square, a thickness ranging from about 100 to about 800 Angstroms, and a bulk resistivity ranging from about 300 to about 4000 μohm·cm. Anode and cathode conductors are defined adjacent to the thin film resistive layer to provide thin film heaters.

An advantage of the exemplary embodiments is that they may provide improved micro-fluid ejection heads having thermal ejection heaters that have lower energy requirements and less sensitivity to parasitic resistance. The heater resistors described herein may also have increased resistance which, for example, enables the resistors to be driven with smaller drive transistors, thereby reducing the substrate area required for active devices to drive the heater resistors. A reduction in the area required for active devices to drive the heaters enables the use of a smaller substrate, thereby reducing the cost of the ejection heads.

BRIEF DESCRIPTION OF THE DRAWINGS

Further advantages of the exemplary embodiments may become apparent by reference to the detailed description of the exemplary embodiments when considered in conjunction with the following drawings illustrating one or more non-limiting aspects of thereof, wherein like reference characters designate like or similar elements throughout the several drawings as follows:

FIG. 1 is a micro-fluid ejection device cartridge, not to scale, containing a micro-fluid ejection head according to an exemplary embodiment;

FIG. 4 is a plan view not to scale of a typical layout on a substrate for a micro-fluid ejection head according to an exemplary embodiment;

DESCRIPTION OF THE EXEMPLARY EMBODIMENTS

With reference to FIG. 1, a fluid cartridge 10 for a micro-fluid ejection device is illustrated. The cartridge 10 includes a cartridge body 12 for supplying a fluid to a micro-fluid ejection head 14. The fluid may be contained in a storage area in the cartridge body 12 or may be supplied from a remote source to the cartridge body.

Figure 2:
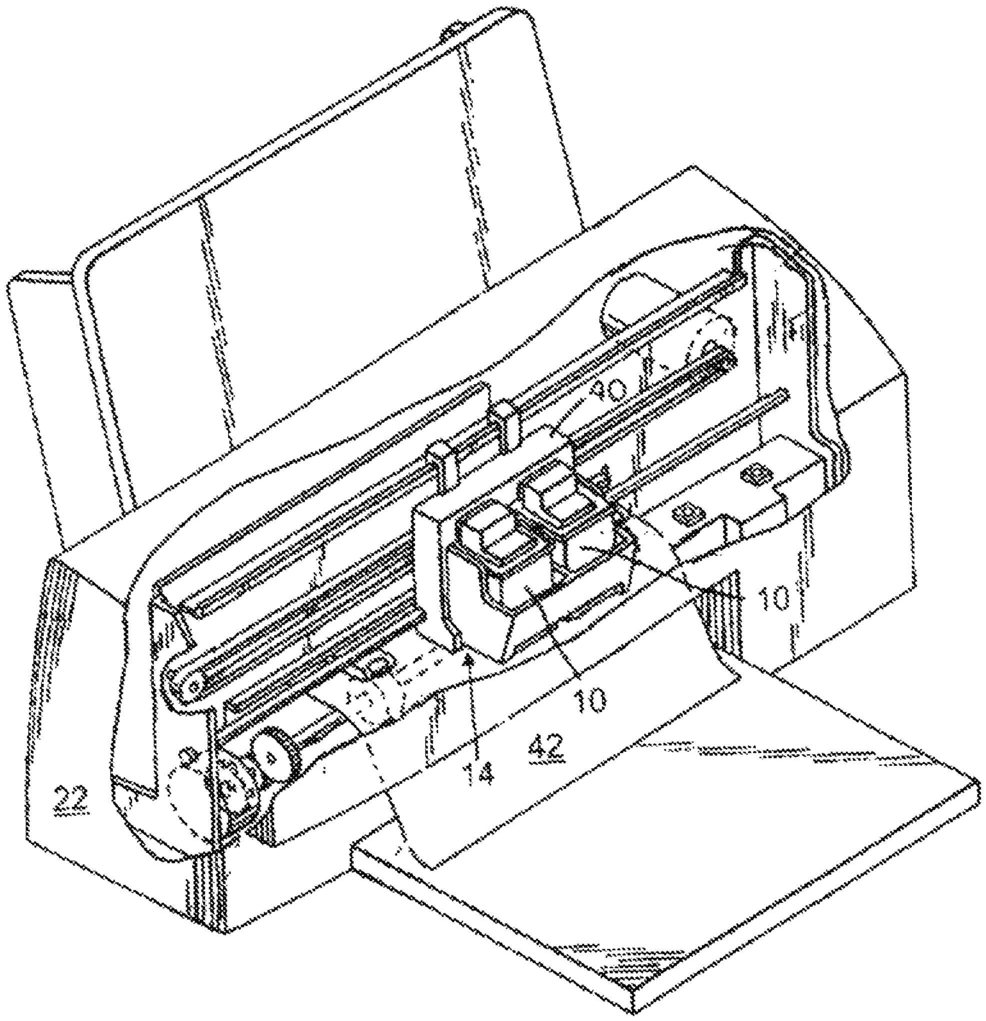
FIG. 2 is a perspective view of an ink jet printer and ink cartridge containing a micro-fluid ejection head according to an exemplary embodiment.

The exemplary micro-fluid ejection head 14 includes a substrate 16 and a nozzle plate 18 containing nozzles 20. The cartridge 10 may be removably attached to a micro-fluid ejection device such as an ink jet printer 22 (FIG. 2). Accordingly, electrical contacts 24 are provided on a flexible circuit 26 for electrically connecting the cartridge 10 to the micro-fluid ejection device 22. The flexible circuit 26 includes electrical traces 28 that are connected to the substrate 16 of the micro-fluid ejection head 14.

Figure 3:
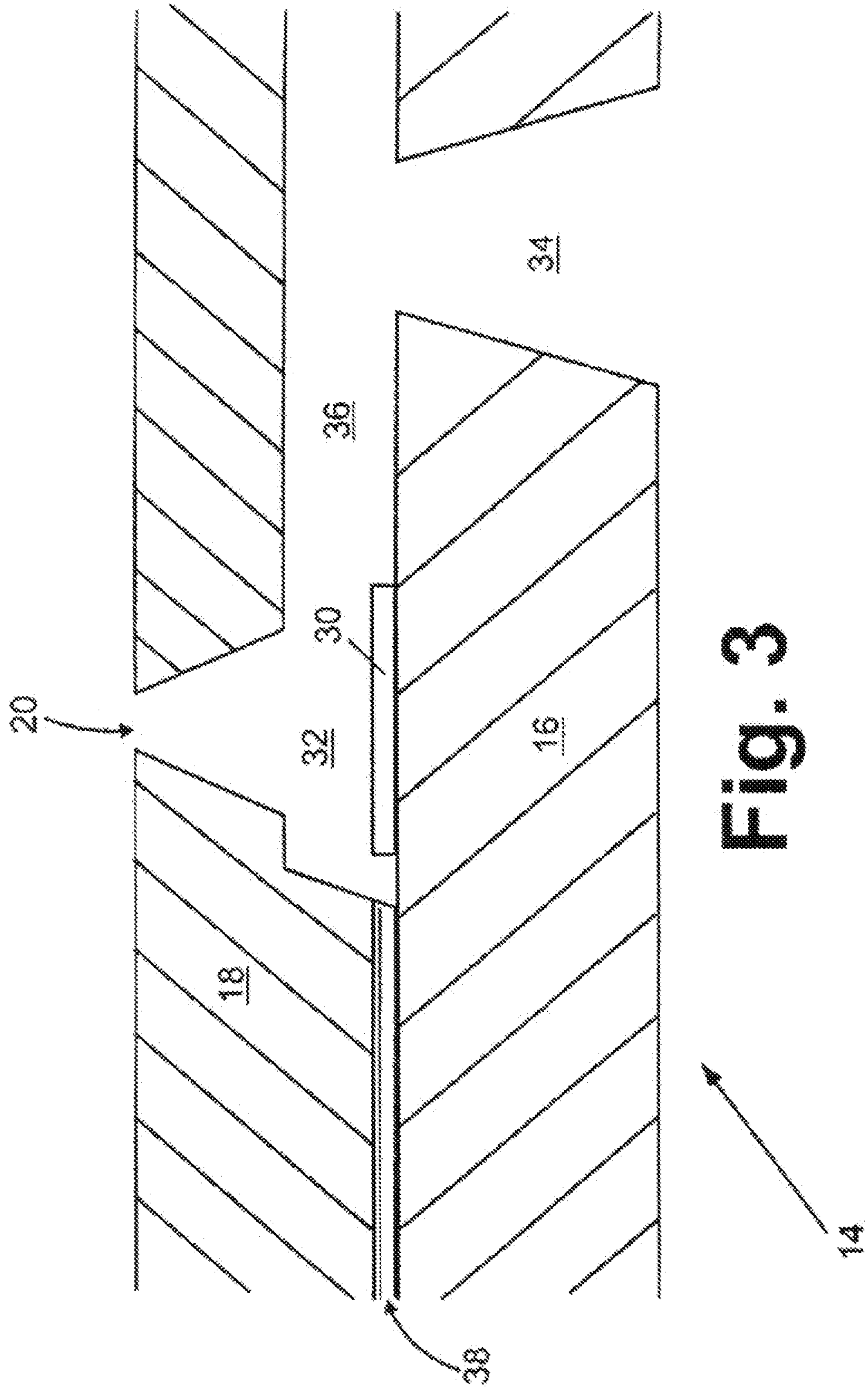
FIG. 3 is a cross-sectional view, not to scale of a portion of a micro-fluid ejection head according to an exemplary embodiment.

An enlarged cross-section view, not to scale, of a portion of the micro-fluid ejection head 14 is illustrated in FIG. 3. The micro-fluid ejection head 14 has a thermal heating element 30, referred to hereinafter as heater 30, as a fluid ejection actuator for heating the fluid in a fluid chamber 32 between the substrate 16 and a nozzle hole 20. The heaters 30, described in more detail below, are thin film heater resistors which, according to an exemplary embodiment, are comprised of silicon, metal, and carbon.

Fluid can be provided to the fluid chamber 32 through an opening 34 in the substrate 16 and through a fluid channel 36 connecting the opening 34 with the fluid chamber 32. The nozzle plate 18 can be adhesively attached to the substrate 16 as by adhesive layer 38. As depicted in FIG. 3, the flow features including the fluid chamber 32 and fluid channel 36 may be formed in the nozzle plate 18. However, the flow features may be provided in a separate thick film layer and a nozzle plate containing only nozzles may be attached to the thick film layer. Other configurations, such as where the flow features are partially formed in both a nozzle plate and a thick film layer, for example, are also contemplated. In an exemplary embodiment, the micro-fluid ejection head 14 is a thermal ink jet printhead. However, the exemplary embodiments described herein are not intended to be limited to ink jet printheads as other fluids, other than ink, may be ejected with a micro-fluid ejection device according to the exemplary embodiments.

Referring again to FIG. 2, the fluid ejection device may be an ink jet printer 22. One such printer 22 includes a carriage 40 for holding one or more cartridge 10 and for moving the cartridges 10 over a medium 42 such as paper for depositing a fluid from the cartridges 10 onto the medium 42. The contacts 24 on the cartridge mate with contacts on the carriage 40 for providing electrical connection between the printer 22 and the cartridge 10. Microcontrollers in the printer 22 control the movement of the carriage 40 across the media 42 and can be used to convert analog and/or digital inputs from an external device such as a computer for controlling the operation of the printer 22. Ejection of fluid from the micro-fluid head 14 can be controlled by a logic circuit on the fluid ejection head 14 in conjunction with the controller in the printer 22.

A plan view, not to scale of the micro-fluid ejection head 14 is illustrated in FIG. 4. The illustrated micro-fluid ejection head 14 includes a substrate 16 and a nozzle plate 18 attached to the substrate 16. A layout of device areas of the substrate 16 is shown providing predetermined locations for logic circuitry 44, driver transistors 46, and heaters 30. As shown in FIG. 4, the substrate 16 may include a single opening 34 for providing fluid such as ink to the heaters 30, which are depicted as being disposed on both sides of the opening 34. However, other exemplary embodiments may include, for example, multiple openings and/or heaters disposed on only one side of the opening(s). In another exemplary embodiment, fluid may flow around edges of the substrate 16 to the heaters rather than flowing through an opening(s) 34 in the substrate. In a further exemplary embodiment, the substrate 16 may include multiple openings, one each for one or more heaters, rather than a single opening 34 in the substrate 16. Meanwhile, the nozzle plate 18, can be made of an ink resistant material such as polyimide, and can be attached to the substrate 16.

Figure 5:
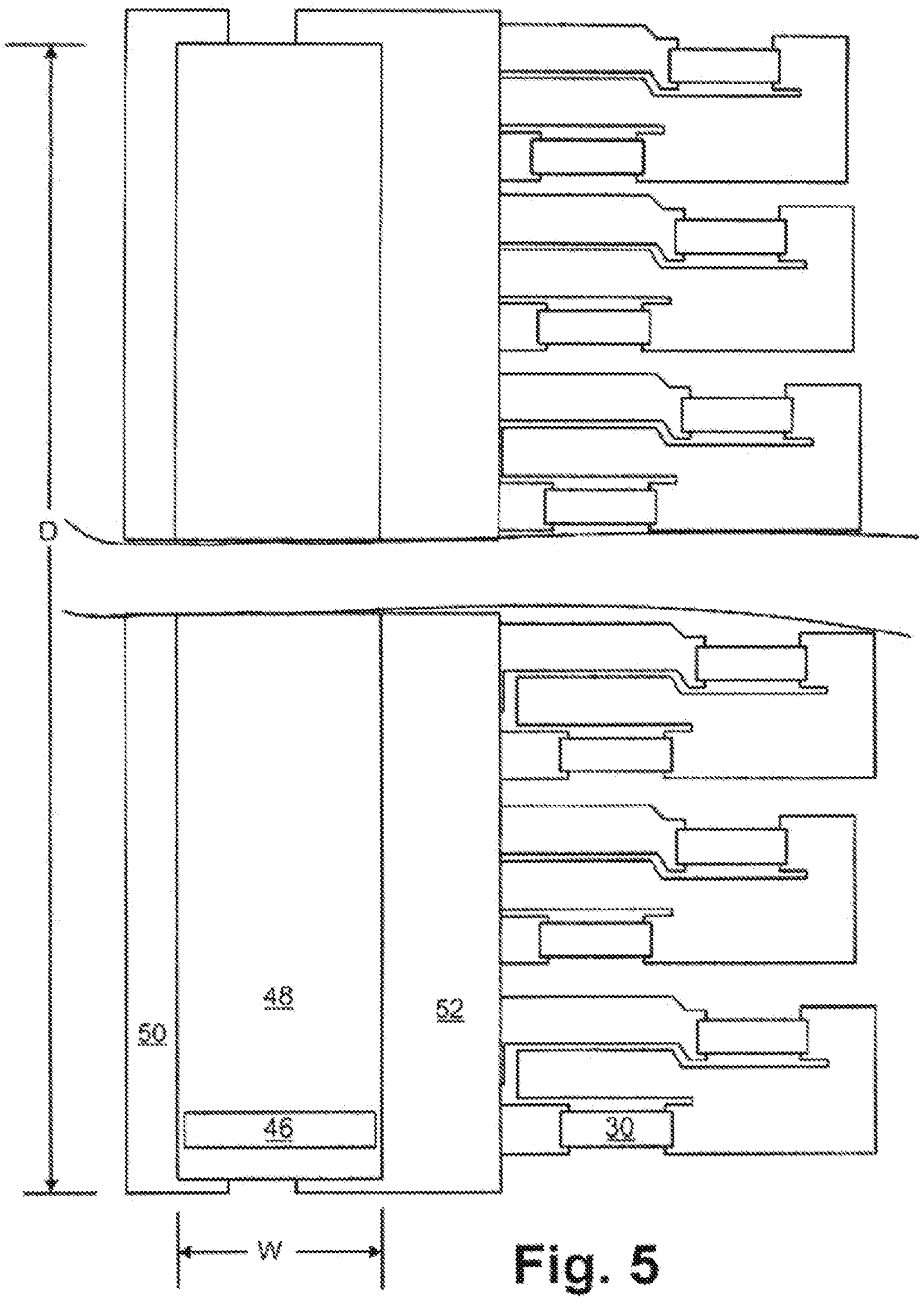
FIG. 5 is a plan view, not to scale of a portion of an active area of a micro-fluid ejection head according to an exemplary embodiment.

An active area 48 of the substrate 16 (e.g., including the driver transistors 46) is illustrated in detail in a plan view of the active area 48 in FIG. 5. This figure represents a portion of a typical heater array and active area 48. A ground bus 50 and a power bus 52 are provided to provide power to the devices in the active area 46 and/or to the heaters 30.

Reducing the driver transistor 46 active area width, indicated by (W), may, for example, reduce the size of the substrate 16 required for the micro-fluid ejection head 14. In an exemplary embodiment, the active area 48 of the substrate 16 may have a width dimension W ranging from about 100 to about 400 microns and an overall length dimension D ranging from about 6,300 microns to about 26,000 microns. The driver transistors 46 may be provided at a pitch P ranging from about 10 microns to about 84 microns, for example.

In one exemplary embodiment, the active area 48 of a single driver transistor 46 on substrate 16 may have an active area width (W) ranging from about 100 to less than about 400 microns and an active area 48 of less than about 15,000 $\mu m^2$. The smaller active area 48 may be achieved by use of driver transistors 46 having gate lengths and channel lengths ranging from about 0.8 to less than about 3 microns.

The resistance of the driver transistor 46 is proportional to its width W. The use of smaller driver transistors 46 increases the resistance of the driver transistor 46. The resistance of the heater 30 may be increased proportionately to maintain a constant ratio between the heater resistance and the driver transistor resistance. A benefit of a higher resistance heater 30 is that the heater requires less driving current, which can allow more heaters to be simultaneously fired. Using higher resistance heaters can also reduce sensitivity to parasitic resistance, wherein such reduced sensitivity can result in less ejection variation between different combinations of heaters being fired. In combination with other features of the heater 30, the exemplary embodiments may provide an ejection head 14 having higher efficiency and an ejection head 14 capable of higher frequency operation.

One approach to providing a higher resistance heater 30 is to use a higher aspect ratio heater, that is, a heater having a length significantly greater than its width. However, such high aspect ratio design tends to trap air in the fluid chamber 32. Another approach to providing a high resistance heater 30 is to provide a heater made from a thin film material having a higher sheet resistance. One such material is TaN. However, relatively thin TaN has inadequate aluminum barrier characteristics thereby making it less suitable than other materials for use in micro-fluid ejection devices. Aluminum barrier characteristics can be particularly important when the resistive layer is extended over and deposited in a contact area for an adjacent transistor device. Without a protective layer, for example TiW, in the contact area, the thin film TaN is insufficient to prevent diffusion between aluminum deposited as the contact metal and the underlying silicon substrate.

Accordingly, a suitable heater 30 may be a thin film heater made of a thin film material derived from silicon, a metal (M), and carbon, such as one having the following formula $Si_xM_yC_z$. Exemplary metals that can be used in such an embodiment include, but are not limited to, chromium, hafnium, molybdenum, tantalum, titanium, tungsten, and zirconium. At least in the case where the metal (M) is chromium or tantalum, x, y, and z can be integers each ranging from about 10 to about 60 and x+y+z=100.

In the case of an embodiment utilizing $Si_xCr_yC_z$, the heater 30 may be formed by a sputtering process wherein a silicon/chromium/carbon target is sputtered adjacent to the substrate 16 in the presence of argon gas. The silicon/chromium/carbon target may have an exemplary composition ranging from about 20 to about 70 atomic percent silicon, from about 10 to about 50 atomic percent chromium, and from about 10 to about 40 atomic percent carbon. The resulting exemplary heater 30 may have a deposited resistive layer composition ranging from about 30 to about 60 atomic percent silicon, from about 20 to about 40 percent chromium, and from about 10 to about 30 atomic percent carbon. Exemplary bulk resistivities of such heaters 30 may range from about 300 to about 4000 micro-ohms-cm.

A process that may be used to sputter a silicon-chromium-carbon resistor material is described for example in U.S. Pat. No. 4,862,143, the relevant disclosure of which is incorporated herein by reference. The sputtering process can be a non-reactive sputtering process. Such a non-reactive sputtering process may result in resistor films having better film uniformity (e.g., since no reactive gas is used during the sputtering). A benefit of the use of thin, high resistance silicon/metal/carbon heaters made according to an exemplary embodiment is that such heaters should have exceptionally good uniformity for both bulk and sheet resistivity. For example, exemplary $Si_xCr_yC_z$ heaters have shown very high film uniformities, such as where the amount of heater film sheet resistance variation across multiples wafers (wafer-to-wafer non-uniformity) has been less than about ±2% (wherein it has been determined that such variations across multiple wafers should ideally be less than about ±12%). In the case of at least $Si_xCr_yC_z$, such heaters should also have a relatively low TCR (e.g., the inventors believe a TCR of less than 200 ppm/° C., such as a TCR of about −60 ppm/° C., can be achieved with $Si_xCr_yC_z$).

Figure 6:
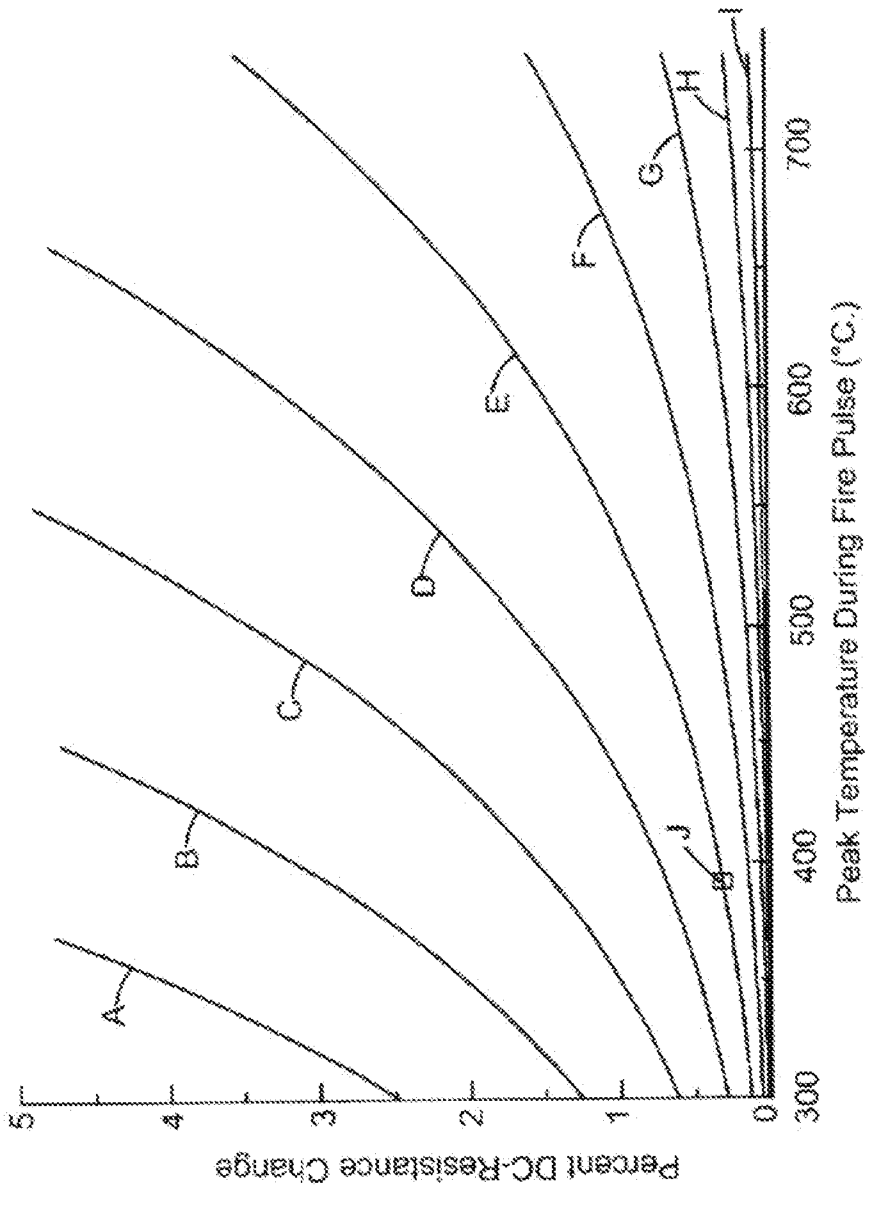
FIG. 6 is a graphical representation of an estimated electromigration response of heaters made according to an exemplary embodiment.

FIG. 6 illustrates an estimated electromigration response for an exemplary $Si_xCr_yC_z$ heater, wherein x=44, y=31, and z=25, which can be used to predict heater stability for various operating temperatures and current densities. The illustrated response is based on a modified Black's equation in which parameters of the equation were generated based on experimental data based on dry fire results and a thermal finite element analysis. As shown by FIG. 6, with reference to point J on Curve E, for an expected operating point wherein a current density of about 105 mA/μm$^2$ will be used to fire a heater to achieve a peak temperature during a fire pulse of about 400° C. (wherein the thermal energy generated by heating the heater is used to supernucleate ink to cause ejection of a droplet(s) of the same), the heaters made according to such an exemplary embodiment are expected to exhibit less than a 1% change in DC resistance after 500,000,000 fires. In FIG. 6, Curves A-I represent different operating current densities (in milliamps per square micron) according to the following table.

| Curve | mA/μm$^2$ |
|---|---|
| A | 130 |
| B | 125 |
| C | 120 |
| D | 115 |
| E | 110 |
| F | 105 |
| G | 100 |
| H | 95 |
| I | 90 |

Figure 7:
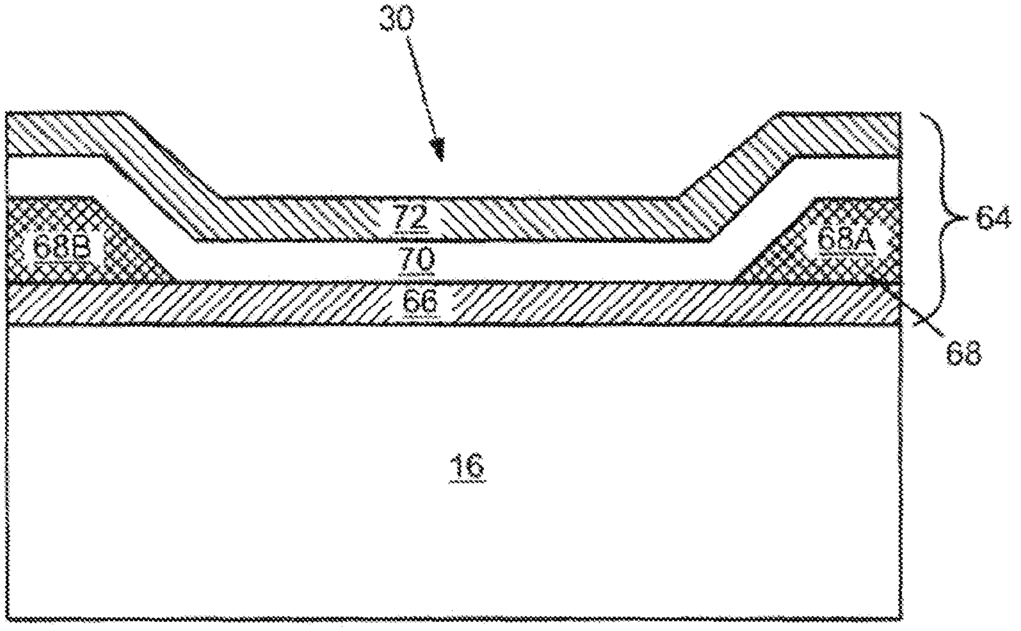
FIG. 7 is a cross-sectional view of a heater stack area of a micro-fluid ejection head according to an exemplary embodiment.

A more detailed illustration of a portion of an ejection head 14 showing an exemplary heater stack 64 including a heater 30 made according to the above described process is illustrated in FIG. 7. The heater stack 64 is provided on an insulated substrate 16. First layer 66 is thin film resistor layer made of a high bulk resistivity $Si_xCr_yC_z$, wherein x, y, and z are as set forth above, which is deposited on the substrate 16 according to the process described above.

After depositing the thin film resistive layer 66, a conductive layer 68, made of a conductive metal such as gold, aluminum, copper, and the like, is deposited on the thin film resistive layer 66. The conductive layer 68 may have a suitable thickness known to those skilled in the art, but typically has a thickness ranging from about 0.4 to about 0.6 microns. After deposition of the conductive layer 68, the conductive layer is etched to provide anode 68A and cathode 68B contacts to the resistive layer 66 and to define the heater 30 between the anode and cathode 68A and 68B.

In another embodiment, a thin barrier layer is deposited between resistive layer and conductive layer, such as to prevent electromigration and material interaction between the resistive layer and the conductive layer. Suitable barrier layer materials can include, for example, titanium, and titanium-tungsten.

A passivation layer 70 may be deposited on the heater 30 and anode and cathode 68A and 68B. The layer 70 may be comprised of a material such as diamond-like carbon, doped diamond-like carbon, silicon oxide, silicon oxynitride, silicon nitride, silicon carbide, and a combination of silicon nitride and silicon carbide. The layer 70 may have a thickness ranging from about 1000 to about 8000 Angstroms.

After depositing the passivation layer 70, a cavitation layer 72 may be deposited and etched to cover the heater 30. A particularly suitable cavitation layer 72 is one comprising tantalum and having a thickness ranging from about from about 1000 to about 6000 Angstroms.

It is often desirable to keep the passivation layer 70 and cavitation layer 72 as thin as possible yet provide suitable protection for the heater 30 from the corrosive and mechanical damage effects of the fluid being ejected. Thin layers 70 and 72 may reduce the overall thickness dimension of the heater stack 64 and provide reduced power requirements and increased efficiency for the heater 30.

Once the cavitation layer 72 is deposited, this layer 72 and the underlying layer or layers 70 may be patterned and etched to provide protection of the heater 30. A dielectric layer, such as one comprised of silicon dioxide, can be deposited over the heater stack 64 and other surfaces of the substrate to provide insulation between subsequent metal layers that are deposited on the substrate for contact to the heater drivers and other devices.

At numerous places throughout this specification, reference has been made to a number of U.S. patents and/or patent publications. The relevant portions of all such cited documents are expressly incorporated in full into this disclosure as if fully set forth herein.

The foregoing embodiments are susceptible to considerable variation in their practice. Accordingly, the embodiments are not intended to be limited to the specific exemplifications set forth hereinabove. Rather, the foregoing embodiments are within the spirit and scope of the appended claims, including the equivalents thereof available as a matter of law.

The patentees do not intend to dedicate any disclosed embodiments to the public, and to the extent any disclosed modifications or alterations may not literally fall within the scope of the claims, they are considered to be part hereof under the doctrine of equivalents.

What is claimed is:

1. A method for making a micro-fluid ejection head, the process comprising:

depositing a thin film material comprising silicon, metal, and carbon (SiMC, wherein M is a metal), the SiMC material comprising $Si_xM_yC_z$, wherein M is chromium, and x, y, and z are integers each ranging from about 10 to about 60 and x+y+z=100, adjacent to a surface of a substrate to form a thin film resistive layer, wherein the thin film resistive layer has a sheet resistance ranging from about 100 to about 600 ohms per square, a thickness ranging from about 100 up to and equal to 800 Angstroms, and a bulk resistivity ranging from about 300 to about 4000 μohm·cm, and wherein the deposited thin film material comprises chromium in an amount of greater than 20 at. % and up to and including about 40 at. %; and defining anode and cathode conductors adjacent to the thin film resistive layer to provide thin film heaters.

2. The method of claim 1, wherein depositing the thin film material comprises sputtering a silicon-chromium-carbon target adjacent to a substrate heated to a temperature ranging from about 100° to about 350° C.

3. The method of claim 1, wherein depositing comprises non-reactive sputtering.

4. The method of claim 1, wherein the thin film material is deposited to form a resistive layer having a thickness ranging from about 200 to about 500 Angstroms.

5. The method of claim 1, wherein the deposited thin film material comprises from about 30 to about 60 at. % silicon and from about 10 to about 30 at. % carbon.

* * * * *